United States Patent
Tan et al.

(10) Patent No.: US 12,002,695 B2
(45) Date of Patent: Jun. 4, 2024

(54) TRANSPORT SYSTEM AND DETERMINATION METHOD

(71) Applicants: KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Avish Ashok Bharwani, Santa Clara, CA (US); Simon Jeyapalan, Newark, CA (US)

(73) Assignees: KAWASAKI JUKOGYO KABUSHIKI KAISHA, Kobe (JP); KAWASAKI ROBOTICS (USA), INC, Wixom, MI (US)

( * ) Notice: Subject to any disclaimer, the term of this patent is extended or adjusted under 35 U.S.C. 154(b) by 0 days.

(21) Appl. No.: 17/343,765

(22) Filed: Jun. 10, 2021

(65) Prior Publication Data

US 2022/0399218 A1  Dec. 15, 2022

(51) Int. Cl.
| | | |
|---|---|---|
| H01L 21/677 | (2006.01) | |
| H01L 21/67 | (2006.01) | |
| H01L 21/68 | (2006.01) | |
| H01L 21/683 | (2006.01) | |
| H01L 21/687 | (2006.01) | |

(52) U.S. Cl.
CPC .. *H01L 21/67265* (2013.01); *H01L 21/67769* (2013.01); *H01L 21/67778* (2013.01); *H01L 21/681* (2013.01); *H01L 21/6838* (2013.01); *H01L 21/68707* (2013.01)

(58) Field of Classification Search
CPC ......... H01L 21/67265; H01L 21/67769; H01L 21/67778; H01L 21/681; H01L 21/6838; H01L 21/68; H01L 21/68707
See application file for complete search history.

(56) References Cited

U.S. PATENT DOCUMENTS

| | | | | |
|---|---|---|---|---|
| 6,400,445 | B2* | 6/2002 | Nishi | G03F 7/70691 355/72 |
| 7,315,373 | B2* | 1/2008 | Fukuzaki | H01L 21/68 356/399 |
| 7,813,542 | B2* | 10/2010 | Lee | G06T 7/33 382/218 |
| 9,268,327 | B2* | 2/2016 | Teramoto | G05B 19/4189 |
| 11,626,309 | B2* | 4/2023 | You | H01L 21/68 414/222.02 |

(Continued)

FOREIGN PATENT DOCUMENTS

| | | | | |
|---|---|---|---|---|
| JP | 05029441 | A | * 2/1993 | |
| JP | 10163302 | A | * 6/1998 | ............ G03F 9/7011 |

(Continued)

*Primary Examiner* — Gerald McClain
(74) *Attorney, Agent, or Firm* — METROLEX IP LAW GROUP, PLLC

(57) ABSTRACT

A transport system includes a robot, sensors (an aligner sensor, a protrusion detecting sensor) and a controller. The robot having a hand which supports a wafer and transports the wafer to an aligner apparatus. The sensor detects the position of the wafer before the robot delivers the wafer to the aligner apparatus while supporting the wafer on the hand. The controller determines the positional deviation of the wafer based on a detection value of the sensor.

15 Claims, 7 Drawing Sheets

(56) References Cited

U.S. PATENT DOCUMENTS

| | | | |
|---|---|---|---|
| 11,862,507 B2 * | 1/2024 | Yoshida | H01L 21/67259 |
| 2010/0080444 A1 * | 4/2010 | Yamaguchi | H01L 21/67748 |
| | | | 700/114 |
| 2010/0171966 A1 * | 7/2010 | Yamamoto | H01L 21/681 |
| | | | 901/14 |
| 2011/0137454 A1 * | 6/2011 | Ohashi | H01L 21/67766 |
| | | | 700/228 |
| 2015/0019004 A1 | 1/2015 | Hiroki et al. | |
| 2017/0263483 A1 * | 9/2017 | Kuwahara | H01L 21/68707 |
| 2017/0372933 A1 * | 12/2017 | Kim | H01L 21/681 |
| 2019/0355604 A1 * | 11/2019 | Kawabe | H01L 21/67742 |
| 2022/0130703 A1 * | 4/2022 | You | G03F 7/70775 |
| 2023/0119986 A1 * | 4/2023 | Osaka | H01L 21/681 |
| | | | 414/751.1 |

FOREIGN PATENT DOCUMENTS

| | | | | |
|---|---|---|---|---|
| JP | 2005019963 A | * | 1/2005 | B05B 13/0228 |
| JP | 2013-211317 A | | 10/2013 | |

* cited by examiner

TRANSPORT SYSTEM AND DETERMINATION METHOD

TECHNICAL FIELD

The present invention relates mainly to a transport system for transporting a wafer by using a robot. In detail, a configuration for detecting a positional deviation of a wafer during the transfer of the wafer.

BACKGROUND ART

PTL 1 (PTL 1: WO2013/211317) discloses a transportation device for transporting a substrate (wafer). The transportation device of PTL 1 includes a storing container, a transportation unit, and an alignment unit. The transportation unit removes the substrate contained in the storing container, and transports to the alignment unit. In the alignment unit, it is recognized how far the substrate is mounted from the center of a rotating base by detecting a peripheral edge of the substrate with a substrate mounted on the rotating base.

SUMMARY OF INVENTION

Technical Problem

In the PTL 1, in the case of the position of a substrate is significantly displaced when a transportation unit removes the substrate, if an alignment unit cannot be properly placed on the substrate, or the substrate is placed on the alignment unit, which causes the substrate may collide with surrounding members. Alternatively, even forming the substrate on the alignment unit, the operation for rotating the substrate failed or the substrate may not be appropriately detected by a sensor.

The present invention has been made in view of the circumstances described above, and a primary object of the present invention is to provide a transport system capable of preventing problems that may occur in the aligner apparatus by the positional deviation of a wafer.

Solution to Problem

Problems to be solved by the present invention are as described above. Solutions to the problems and advantageous effects thereof will now be described.

A first aspect of the present invention provides a transport system configuration for as follows. That is, the transport system includes a robot, a sensor, and a determination unit. The robot having a hand which supports the wafer and transports the wafer to the aligner apparatus. The sensor detects the position of the wafer while supporting the wafer on the hand before the robot delivers the wafer to the aligner apparatus. The determination unit determines a positional deviation of the wafer based on the detection value of the sensor.

A second aspect of the present invention provides a determination method as described below. That is, for the determination method, the positional deviation of the wafer is determined during the transfer of the wafer. A robot hand is used to supports the wafer and transports the wafer to the aligner apparatus. The position of the wafer edge will be detected by using a sensor, before the robot delivers the wafer to the aligner apparatus while supporting the wafer on the hand. The positional deviation of the wafer will be determined based on the detection value of the sensor.

As a result, since the positional deviation of the wafer is detected before the wafer is formed on the aligner apparatus, the problems that may occur in the aligner apparatus by the positional deviation of a wafer can therefore be prevented.

Effect of the Invention

According to the present invention can be provided a transport system capable of preventing problems that may occur in an aligner apparatus by a positional deviation of a wafer.

DESCRIPTION OF EMBODIMENTS

Figure 1:
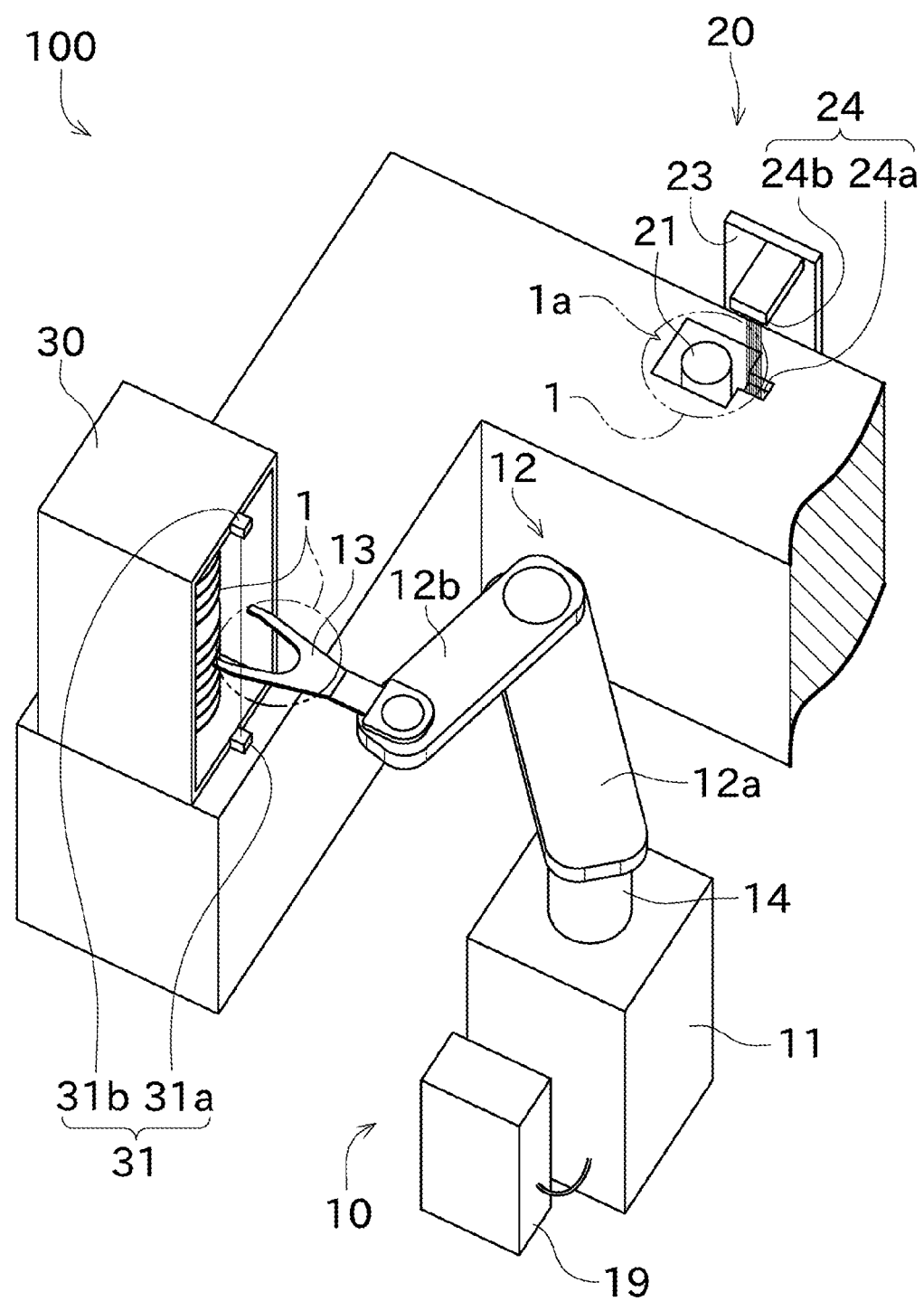
FIG. 1 is a perspective view showing an overall configuration of a transport system according to an embodiment of the present invention.

Next, an embodiment of the present invention will now be described with reference to the drawings. FIG. 1 is a perspective view showing a configuration of a transport system 100.

The transport system 100 shown in FIG. 1 is a system for transporting a wafer 1 which is an object to be transported in work space such as a clean room. Specifically, the transport system 100 includes a robot 10 and a controller (determination unit) 19. The robot 10 of in this present embodiment removes the wafer 1 contained in a housing 30, and transports to an aligner apparatus 20.

In this embodiment, the robot 10 is achieved by a SCARA type horizontal articulated robot. SCARA is an abbreviation for Selective Compliance Assembly Robot Arm.

The wafer 1 transported by the robot 10 is a semiconductor wafer. The wafer 1 is formed in a shape of a thin circular plate. The wafer 1 may be a glass wafer instead of the semiconductor wafer.

As shown in FIG. 1, the robot 10 includes a base 11, an arm 12, and a hand 13.

The base 11 is fixed to, for example, a floor of the factory. However, without being limited to this, for example, the base 11 may be fixed to an appropriate processing plant.

As shown in FIG. 1, the arm 12 is mounted to the base 11 via a lifting shaft 14 that can move in the vertical direction. The arm 12 can be rotated relative to the lifting shaft 14.

The arm 12 is a horizontal articulated type arm. The arm 12 includes a first arm 12a and a second arm 12b.

The first arm 12a is an elongated member extending in a linear shape arranged in horizontal. One end of the longitudinal direction of the first arm 12a is mounted to the upper end part of the lifting shaft 14. The first arm 12a is rotatably supported with the axis (vertical axis) of the lifting shaft 14 as the center. The second arm 12b is mounted to the other end of the longitudinal direction of the first arm 12a.

The second arm 12b is an elongated member extending in a linear shape arranged in horizontal. One end of the longitudinal direction of the second arm 12b is mounted to the end of the first arm 12a. The second arm 12b is rotatably supported with the axis (vertical axis) parallel to the lifting shaft 14 as the center.

The hand 13 is connected to the second arm 12b. The hand 13 is mounted to the end of the second arm 12b. The hand 13 is rotatably supported with the axis (vertical axis) parallel to the lifting shaft 14 as the center. The hand 13 is rotationally driven by an appropriate actuator (not shown). This actuator is, for example, an electric motor.

The hand 13 of this present embodiment is a passive grip-type hand having a branching structure. The passive grip-type is a configuration in which a wafer 1 placed on the hand 13 is not fixed. The end of the hand 13 is branched into two, and the wafer 1 is placed on the portion having the branch.

The hand 13 is not limited to the edge grip-type. The hand 13 may be an adsorption-type. The adsorption-type is a configuration (e.g., Bernoulli chuck) that the surface of the wafer 1 is sucked and transported with a negative pressure. Alternatively, the hand 13 may be an edge grip-type. The edge grip-type is a configuration in which the wafer 1 is interposed and hold by using a plurality of guides provided on the hand 13.

In this embodiment, one hand 13 is provided on the arm 12. Instead of this configuration, two or more hands 13 may be provided on the arm 12. For example, two hands 13 are provided at the end of the second arm 12b of the arm 12. The two hands 13 can be rotated independently around the vertical axis as the center. Consequently, for example, the robot 10 can be simultaneously conveyed two wafers 1.

Figure 2:
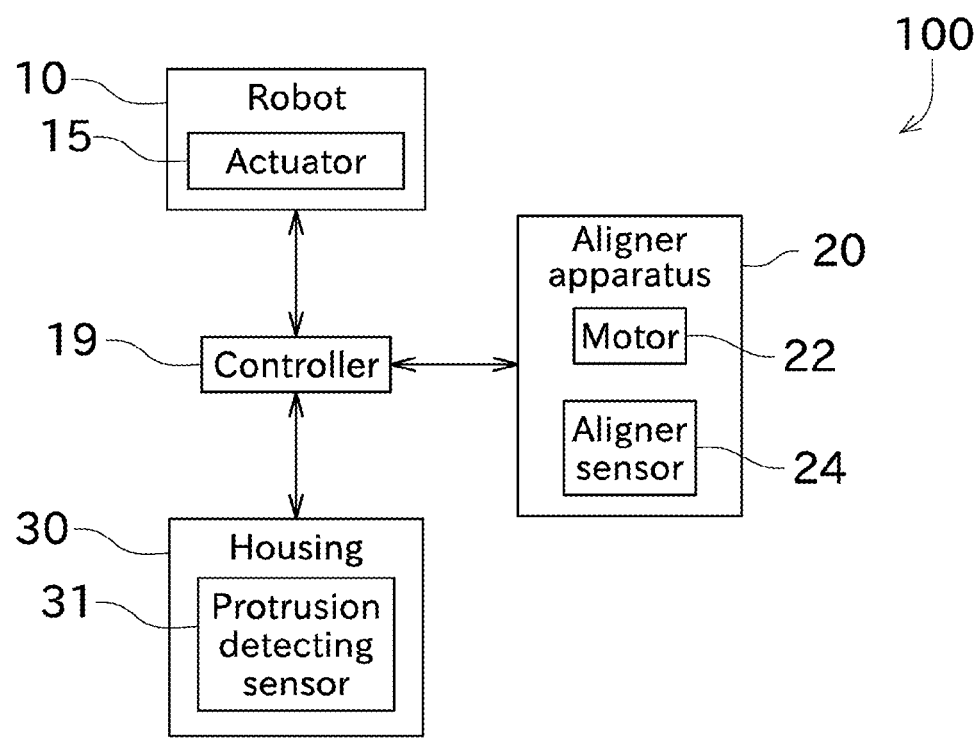
FIG. 2 is a block diagram of a transport system.
Figure 3:
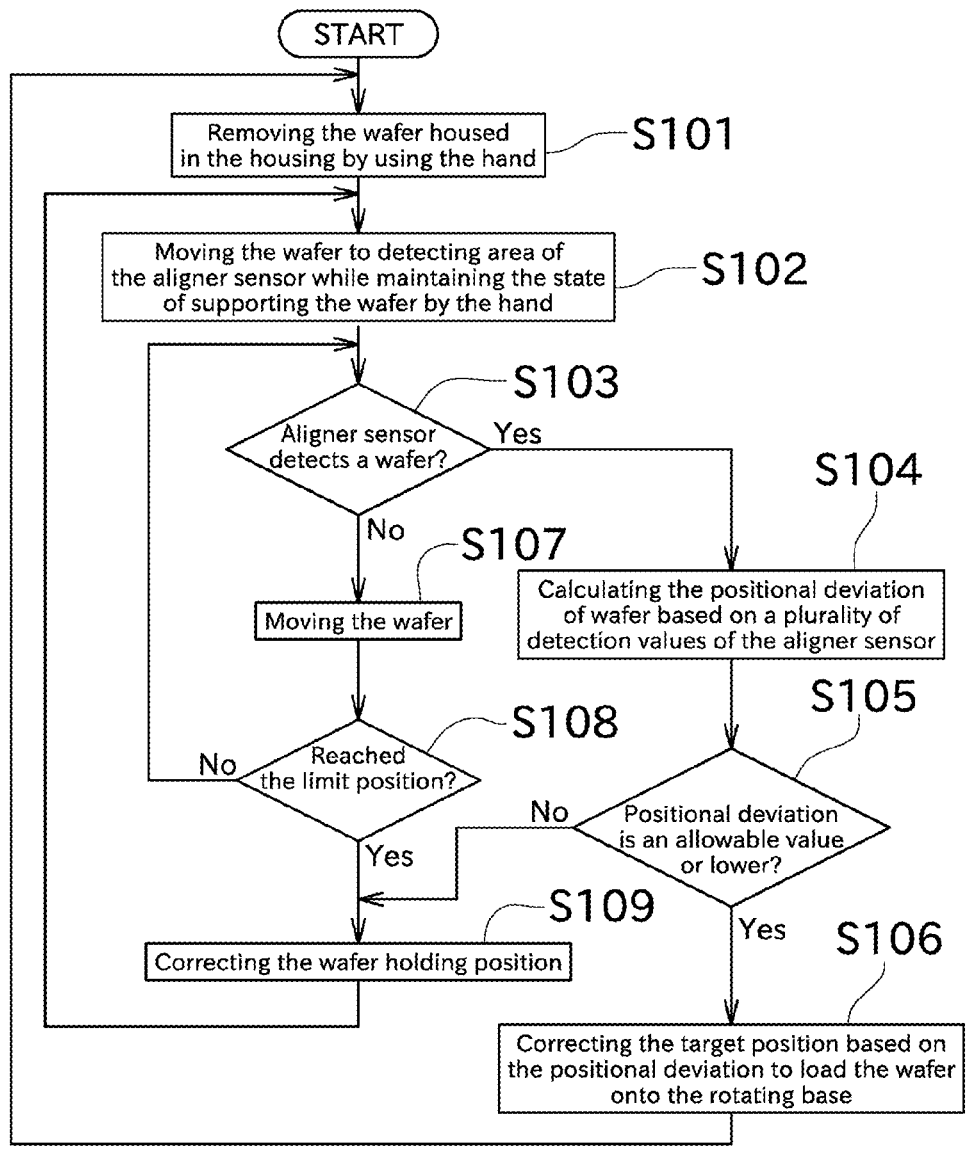
FIG. 3 is a flowchart showing the process for determining a positional deviation of a wafer by using an aligner sensor.

Each of the lifting shaft 14, the first arm 12a and the second arm 12b is driven by an actuator 15 shown in the block diagram of FIG. 2. The actuator 15 is, for example, an electric motor.

In an arm joint unit located between the lifting shaft 14 and the first arm 12a, between the first arm 12a and the second arm 12b, and between the second arm 12b and the hand 13, an encoder (not shown) that detects each rotational position of the first arm 12a, the second arm 12b and the hand 13 are mounted. In addition, at an appropriate position of the robot 10, an encoder that detects a change in position of the first arm 12a in the height direction (that is, the lifting quantity of the lifting shaft 14) is also provided.

A controller 19 includes an arithmetic unit such as a CPU and a storage apparatus such as a HDD, a SSD, or a flash memory. The arithmetic unit controls the robot 10 by executing the program stored in the storage device. Specifically, the controller 19 transmits a command value to the actuator 15 in accordance with the registering working contents and the detection result of encoder for example. These conditions, the robot 10 performs the conveying operation of the wafer 1. The controller 19 further controls the aligner apparatus 20 (details given later).

In the present embodiment, the controller 19 controls the robot 10 and the aligner apparatus 20. Instead of this, a controller that controls the aligner apparatus 20 and a controller that controls the robot 10 may be separate.

The aligner apparatus 20 performs alignment which adjusts to acquire the rotation phase of the wafer 1. The rotation phase is the orientation of the wafer 1 that varies by the change in the rotation of the wafer 1. A notch 1a is formed on the outer circumferential of the wafer 1. The notch 1a indicates the crystal orientation of semiconductor. When an orientation flat is formed on the wafer 1 instead of the notch 1a, the aligner apparatus 20 may be configured to detect the orientation flat.

The aligner apparatus 20 includes a rotating base 21, a motor 22, a fitting member 23, and an aligner sensor 24.

The rotating base 21 is a disk-shape and is arranged so as to face in the vertical direction. The wafer 1 is placed on the rotating base 21 by the robot 10. The shape of the rotating base 21 is not limited to a disk-shape. By transmitting the driving force of the motor 22, the rotating base 21 rotates around the vertical direction as the center.

The fitting member 23 is fixed at an appropriate position in the factory, for example, a member for supporting the rotating base 21 of the aligner apparatus 20, a member for supporting the housing 30, or a floor of the factory. A part of the aligner sensor 24 is mounted to the fitting member 23.

The aligner sensor 24 is a line sensor and includes a light emitting unit 24a and a light receiving unit 24b. The aligner sensor 24 of this present embodiment is a transmission-type light detecting sensor. Therefore, the light emitting unit 24a and the light receiving unit 24b are arranged at intervals in the vertical direction (thickness direction of the wafer 1) so as to sandwich the wafer 2. In the present embodiment, the light emitting unit 24a is on the lower side, but the light emitting unit 24a may be on the upper side.

The light emitting unit 24a irradiates an inspection light toward the light receiving unit 24b. In the case of the wafer 1 is located between the light emitting unit 24a and the light receiving unit 24b, the light receiving unit 24b receives the inspection light partially blocked by the wafer 1. The light receiving unit 24b transmits a current signal (or a voltage signal converted thereof) corresponding to the light quantity of the received inspection light to the controller 19. While the notch 1a is located on the detection range of the aligner sensor 24, the light quantity of the inspection light increases. Therefore, the controller 19 acquires the rotation phase of the notch 1a of the wafer 1 placed on the rotating base 21 based on the current signal output by the aligner sensor 24 (the light receiving unit 24b) and the rotation phase of the rotating base 21. Thereafter, the aligner sensor 24 adjusts the rotation phase of the wafer 1 by rotating the wafer 1 (the rotating base 21) so that the notch 1a faces a predefined direction under the control of the controller 19.

The aligner sensor 24 is not limited to a light detecting sensor, and may be, different types of sensors. For example, a CCD (Charge Coupled Device) sensor can be used as the aligner sensor 24. The CCD sensor detects the position of the edge of the wafer 1 to transmits of that position to the controller 19. The edge of the wafer 1 is the ends in the radial direction of the wafer 1 and the part in the vicinity thereof. By analyzing the detection result of the edge of the wafer 1 by the CCD sensor, it is possible to detect whether or not the notch 1a is located in the detection range of the CCD sensor. Therefore, similar to the case of using the light detecting sensor as aligner sensor 24, the controller 19 acquires the rotation phase of the notch 1a of the wafer 1 placed on the rotating base 21, The housing 30 is a container for containing a plurality of wafers 1 arranged in the thickness direction. In the housing 30A, a housing space is formed for containing the wafer 1. A plurality of wafer supporters for placing the edges of the wafer 1 are formed in the housing 30. The housing 30 may be a conveyable container or a shelf fixed to a floor or the like.

A protrusion detecting sensor 31 is mounted to the housing 30. The protrusion detecting sensor 31 is a sensor that detects whether or not the wafer 1 contained in the housing 30 projects from the housing space (whether or not the wafer 1 is located on the outer side of the housing space). The protrusion detecting sensor 31 includes a light emitting unit 31a and a light receiving unit 31b. The light emitting unit 31a and the light receiving unit 31b are arranged at intervals in the vertical direction (the arranged directions of the wafer 1). The light emitting unit 31a irradiates an inspection light toward the light receiving unit 31b. In the case of the wafer 1 is located between the light emitting unit 31a and the light receiving unit 31b, the light receiving unit 31b receives the inspection light. In the case of the wafer 1 is located between the light emitting unit 31a and the light receiving unit 31b, the light receiving unit 31b does not receive the inspection light. The light receiving unit 31b transmits a signal that indicates whether or not the inspection light has been received to the controller 19.

The robot 10 removes and supports the wafer 1 by positioning the hand 13 in the lower part of the wafer 1 contained in the housing 30 and lifting the hand 13. Here, if the position of the wafer 1 contained in the housing 30 is displaced, or if the position of the wafer 1 is displaced when the hand 13 removes the wafer 1, the position of the wafer 1 supported by the hand 13 may shift. In this case, the wafer 1 may not be formed at the center of the rotating base 21, and the alignment may not be performed properly. Alternatively, when the positional deviation of the wafer 1 is large, the wafer 1 may collide with the fitting member 23. And thus, in the transport system 100 of this present embodiment, the position of the wafer 1 will be detected before the robot 10 delivers the wafer 1 to the aligner apparatus 20 while supporting the wafer 1 on the hand 13. The position of the wafer 1 can be detected by using the aligner sensor 24 or the protrusion detecting sensor 31. This will be specifically described below.

First, with reference to FIG. 3 to FIG. 6, in a state that the wafer 1 is supported on the hand 13 by using the aligner sensor 24 while detecting the position of the wafer 1, the process for transporting the wafer 1 to the aligner apparatus 20 from the housing 30 will be described.

Figure 4:
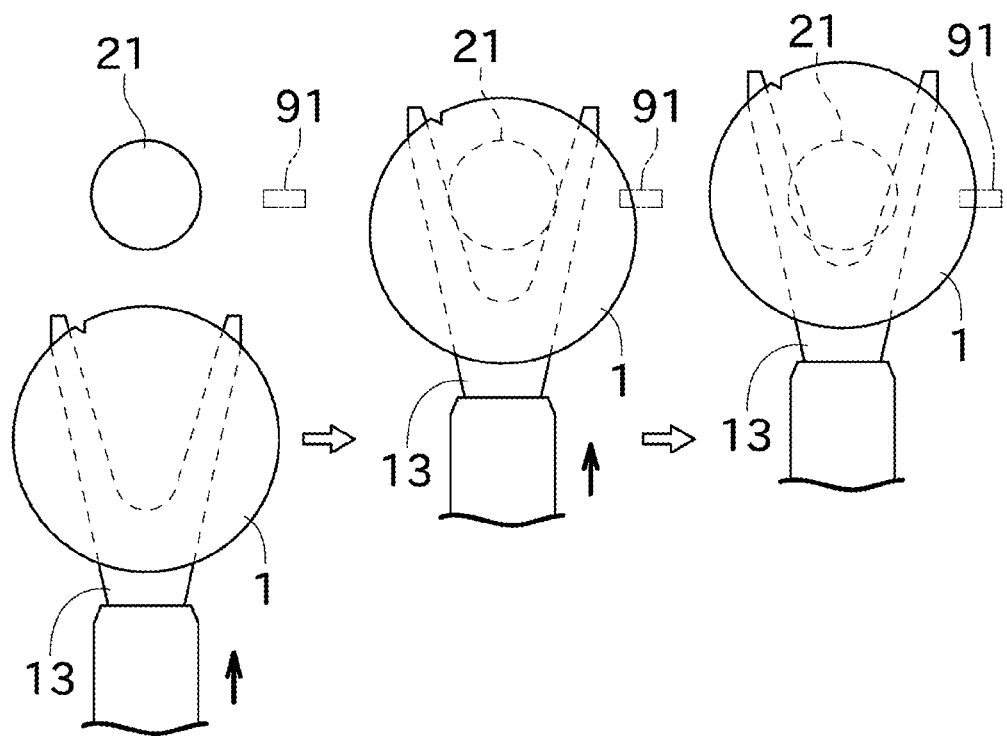
FIG. 4 is a diagram showing the condition for determining a positional deviation of a wafer by using an aligner sensor.

The controller 19 removes the wafer 1 contained in the housing 30 by using the hand 13 (S101). Next, the controller 19 moves the wafer 1 to a detecting area 91 of the aligner sensor 24 by moving the arm 12 while maintaining the state of supporting the wafer 1 by the hand 13 (S102). As shown in FIG. 4, the controller 19 brings the center of the hand 13 closer to the center of the rotating base 21 because of the detecting area 91 of the aligner sensor 24 is in the vicinity of the rotating base 21.

The light receiving unit 24b of the aligner sensor 24 transmits the above-described current signal to the controller 19 at predetermined time intervals. Therefore, when the edge of the wafer 1 enters the detecting area 91, the edge of the wafer 1 will be detected a plurality of times during move the wafer 1. The controller 19 determines whether or not the aligner sensor 24 detects the wafer 1 (S103), and when the aligner sensor 24 detects the wafer 1, the positional deviation of the wafer 1 is calculated in accordance with a plurality of detection values of the aligner sensor 24 (S104).

The positional deviation of the wafer 1 is the current difference of positions of the wafer 1 with regards to the specified position of the wafer 1 (the determined position of the teaching of the robot 10, the position of the wafer 1 when the center of the hand 13 and the center of the wafer 1 is matched each other). Specifically, the positional deviation will be displayed by the coordinate value of the plane coordinate system. Although calculating methods for the positional deviation of the wafer 1 may vary widely, the method shown in the following can be used for example.

That is, when the wafer 1 is in the specified position based on the position of the hand 13, it is estimated how the detection value of the aligner sensor 24 is changed, and store it as a reference value. Then, based on the position of the hand 13, compare the reference value, and the detection value actually detected by the aligner sensor 24. When the position of the wafer 1 deviates in the back-and-forth direction (the vertical direction in FIG. 4), the start timing of that the aligner sensor 24 detects the edge of the wafer 1 is different from the reference value. For example, when the position of the wafer 1 is in the front of the specified position, the aligner sensor 24 detects the edge of the wafer 1 at a timing earlier than the reference value. In this result, the positional deviation of the wafer 1 in the back-and-forth direction can be calculated in accordance with the start timing of that the aligner sensor 24 detects the edge of the wafer 1. Furthermore, when with the position of the wafer 1 deviates in right-and-left direction (right-and-left direction in FIG. 4), the minimum value of the detection value of the aligner sensor 24 is different from the reference value. For example, when the position of the wafer 1 is in the left side than the specified position, the area blocking the detecting area 91 becomes small, so that the minimum value of the detection value of the aligner sensor 24 will be larger. In this result, the positional deviation of the wafer 1 in the right-and-left direction can be calculated in accordance with the minimum value of the detection value of the aligner sensor 24. As described above, the controller 19 can be calculated the positional deviation of the wafer 1 in the front, back, left and right directions.

Further, the case of using the CCD sensor as the aligner sensor 24, the position of the edge of the wafer 1 can be specifically specified in accordance with the detection result of the edge of the wafer 1 by the CCD sensor. And thus, even when the CCD sensor is used as the aligner sensor 24, the positional deviation of the wafer 1 can be calculated in accordance with the detection value of the aligner sensor 24.

Next, the controller 19 determines whether or not the positional deviation of the wafer 1 calculated in step S104 is an allowable value or lower (S105). The allowable value is, for example, when the hand 13 places the wafer 1 on the rotating base 21, a value within a range in which the wafer 1 may not collide with the fitting member 23 and the like will be set. In other words, in the case where the positional deviation of the wafer 1 is an allowable value or lower, the hand 13 can appropriately perform the operation of placing the wafer 1 on the rotating base 21. The allowable values may be set individually in the back-and-forth direction and the right-and-left direction. Alternatively, an allowable value may be set for the distance from the wafer 1 in the specified position to the actual wafer 1.

Figure 5:
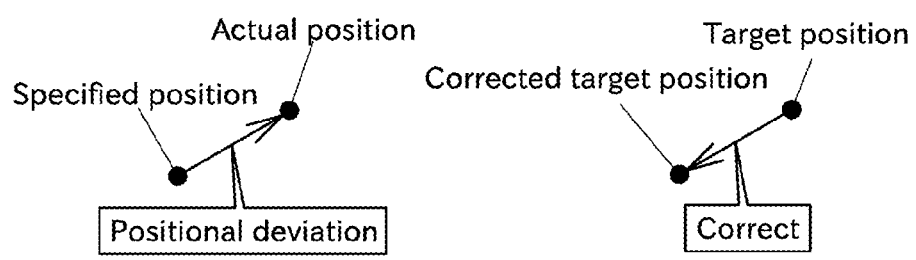
FIG. 5 is a diagram showing the method for creating a target position of a wafer based on a positional deviation.

In the case where the positional deviation of the wafer 1 is an allowable value or lower, the controller 19 corrects the target position based on the positional deviation, and is loaded the wafer 1 onto the rotating base 21 of the aligner apparatus 20 (S106). More specifically, as shown in FIG. 5, so as to offset the influence of the positional deviation, the wafer 1 is loaded at the corrected target position in which the target position is moved in the direction opposite to the positional deviation and only by the same length of that positional deviation. And then, the controller 19 repeats the subsequent processing of step S101.

In the case where the positional deviation exceeds the allowable value, the controller 19 corrects the holding position of the wafer 1 by the hand 13 (S109). Specifically, after placing the wafer 1 once to another place (for example, housing 30), corrects the holding position of the wafer 1 by the hand 13 with removing the wafer 1 again. Instead of the process of correcting the holding position of the wafer 1, an error may be notified and the operation may be stopped.

Figure 6:
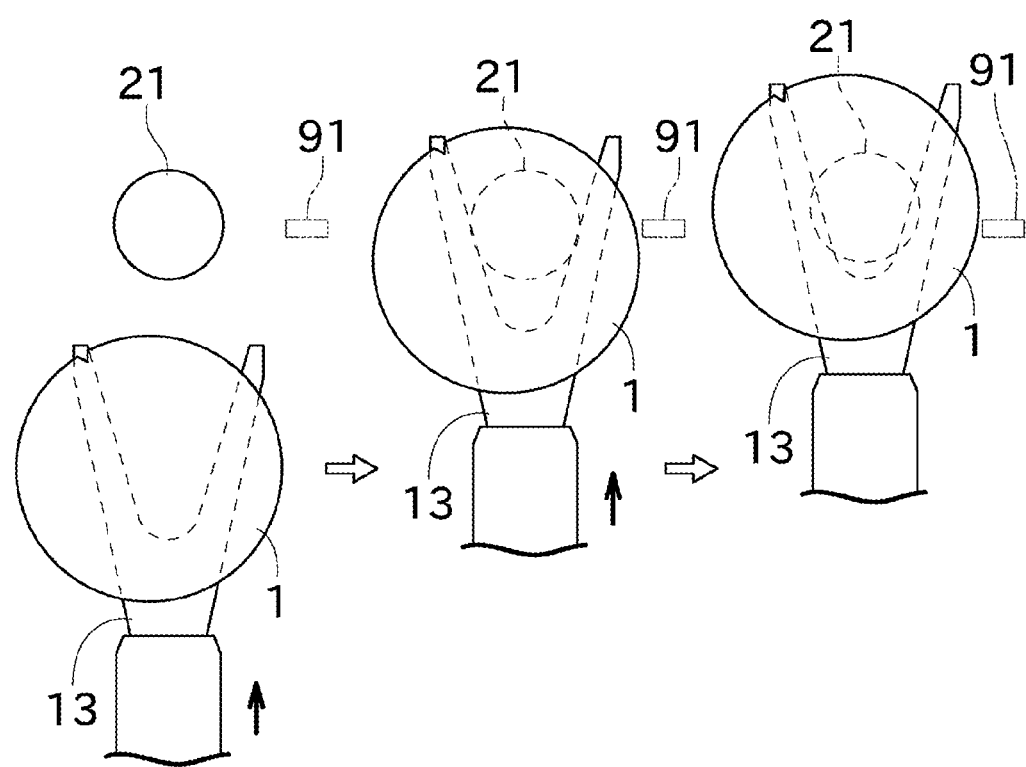
FIG. 6 is a diagram showing the state in which a positional deviation of a wafer is not detected because of an aligner sensor is large.

Further, as shown in FIG. 6, when the position of the wafer 1 deviates largely in right-and-left direction to the side opposite to the detecting area 91, the wafer 1 may not be detected by the detecting area 91. In such a situation, the controller 19 performs the following processing for preventing collides of the wafer 1 and the fitting member 23. That is, in the step S103, when the aligner sensor 24 determines that the wafer 1 does not detect, the controller 19 moves the wafer 1 by moving the hand 13 (S107), and is determined whether or not the hand 13 has reached the limit position (S108). The limit position is a position where there is no possibility of a collision between the wafer 1 and the fitting member 23. In other words, if the position of the wafer 1 moves forward beyond the limit position, there is a possibility that the position of the hand 13 contacts with the fitting member 23. Consequently, when the hand 13 is reached the limit position, the controller 19 determines that the positional deviation of the wafer 1 exceeds the allowable value, and then corrects the holding position of the wafer 1 as above-described (S109). Specifically, if there is a possibility that the wafer 1 may collide with an object other than the fitting member 23, a limit position will be set in consideration of the position of the object therefore.

By performing the above processing, while preventing collides of the wafer 1 and the fitting member 23 for example, the positional deviation of the wafer 1 can be corrected and continue the work for transporting the wafer 1.

Figure 7:
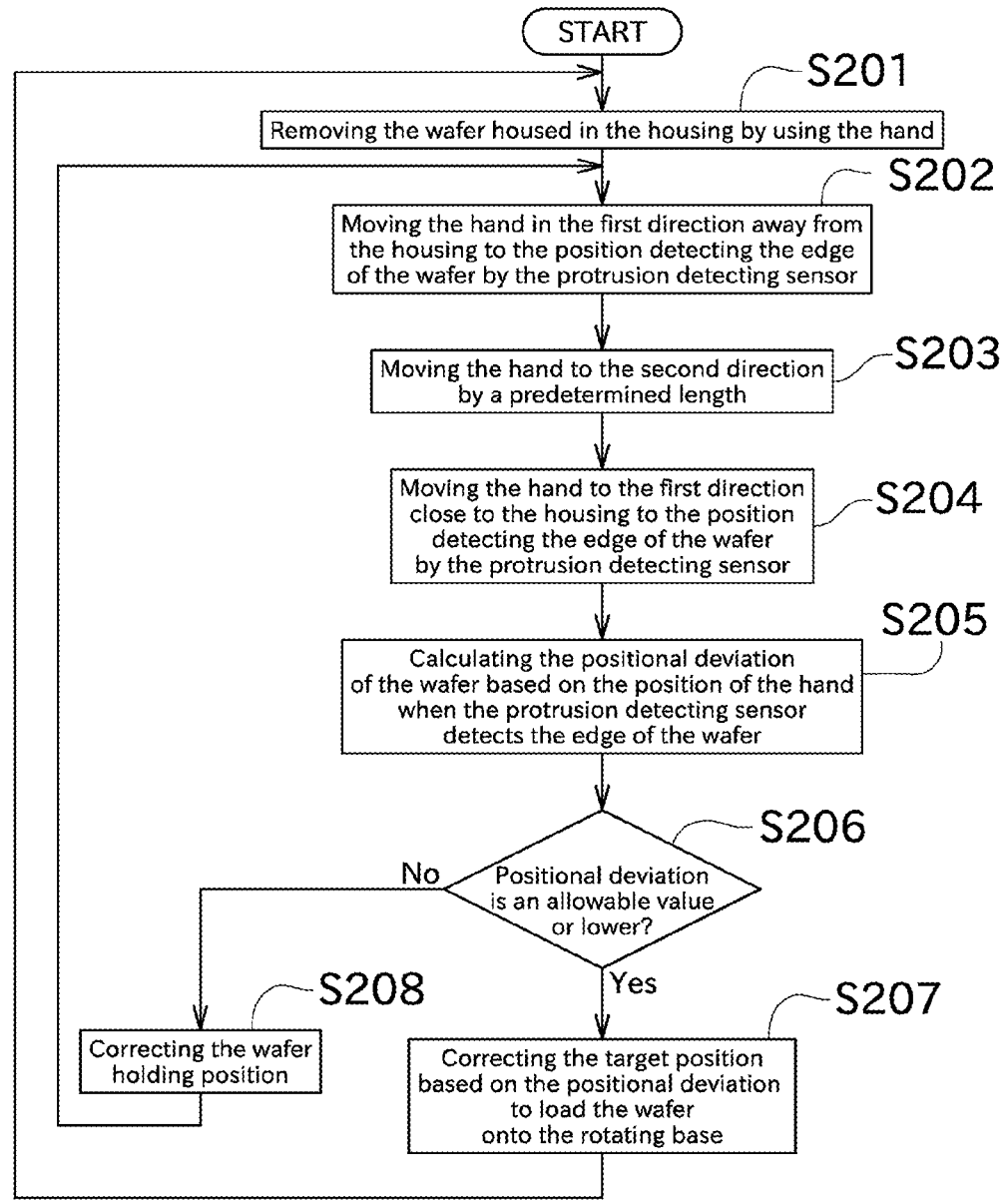
FIG. 7 is a flowchart showing the process for determining a positional deviation of a wafer by using a protrusion detecting sensor.

Next, with reference to FIG. 7 and FIGS. 8, in a state that the wafer 1 is supported on the hand 13, while detecting the position of the wafer 1 by using the protrusion detecting sensor 31, the process for transporting the wafer 1 to the aligner apparatus 20 from the housing 30 will be described.

The controller 19 removes the wafer 1 housed in the housing 30 by using the hand 13 (S201). Next, the controller 19 moves the hand 13 in a direction away (the first direction, the rear) from the housing 30 to the position in which the protrusion detecting sensor 31 detects the edge of the wafer 1 (S202). More specifically, when after moving immediately the hand 13 to the first direction, a detecting area 92 of the protrusion detecting sensor 31 is overlapped the wafer 1 (the top left in FIG. 8). Then, by moving the hand 13 to the first direction, the detecting area 92 is not overlapped the wafer 1 (the top right in FIG. 8). That is, the protrusion detecting sensor 31 can be detected the edge of the wafer 1, based on the state in which the protrusion detecting sensor 31 does not detect the wafer 1 from the state in which the protrusion detecting sensor 31 detects the wafer 1. In addition, the position of the hand 13 at this time is referred to as a first position.

Figure 8:
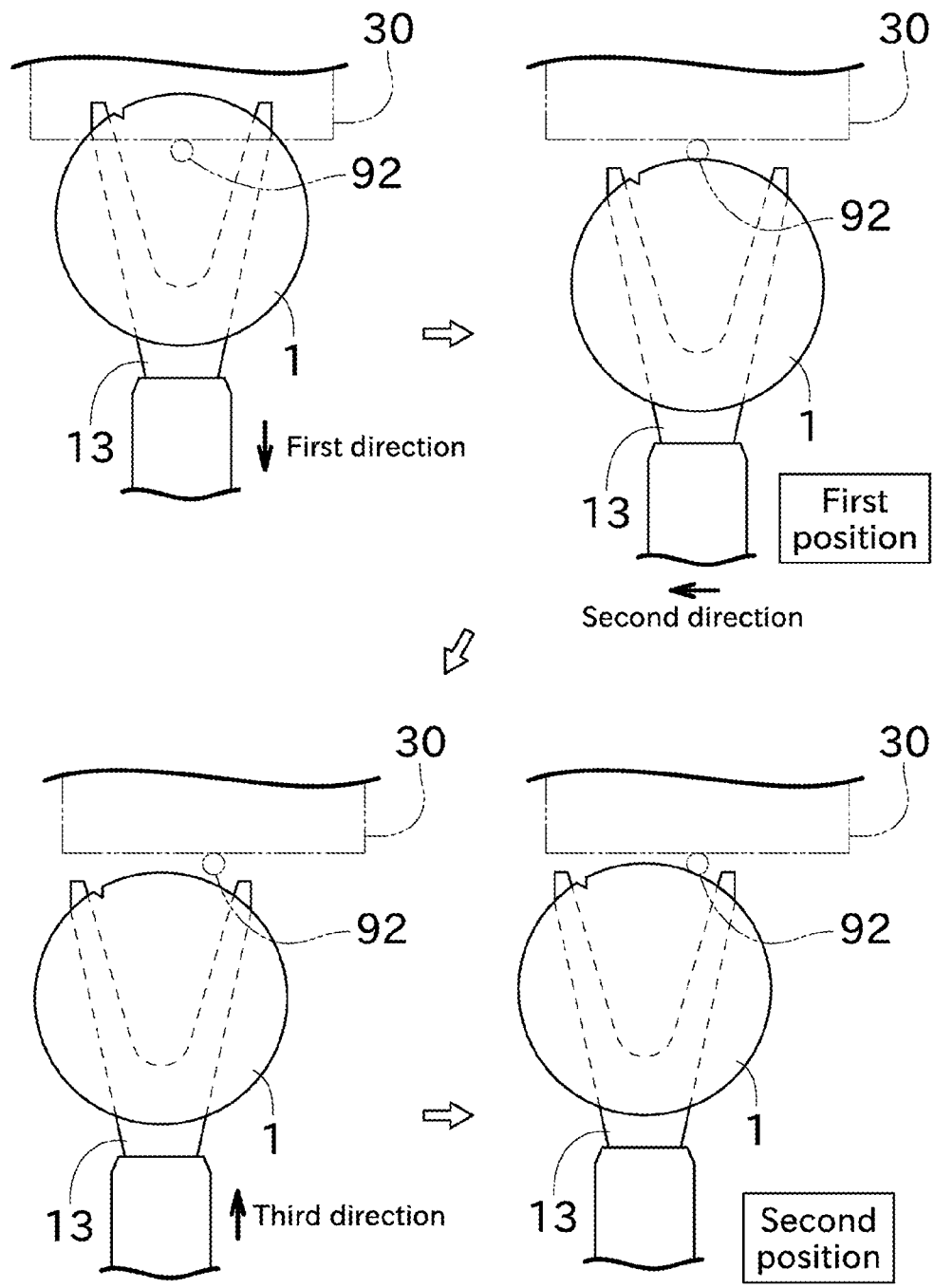
FIG. 8 is a diagram showing the conditions for determining a positional deviation of a wafer by using a protrusion detecting sensor.

Next, the controller 19 moves the hand 13 only by a predetermined length to a direction different from the first direction (a second direction, a first direction, or either left or right) (S203, FIG. 8 from the top right to the lower left of FIG. 8). Next, to the position detecting again the edge of the wafer 1 by the protrusion detecting sensor 31, the controller 19 moves the hand 13 in a third direction (forward, opposite direction to the first direction) close to the housing 30 (S204, the lower right from the lower left of FIG. 8). The position of the hand 13 when the protrusion detecting sensor 31 detects the edge of the wafer 1 again is referred to as a second position. In addition, it is also possible to calculate the positional deviation of the wafer 1 by the above-described method by using another sensor arranged other than the housing 30.

Next, the controller 19 calculates the positional deviation of the wafer 1 based on the positions of the hands 13 (two positions of the present embodiment) when the protrusion detecting sensor 31 detects the edge of the wafer 1 (S205). More specifically, when the wafer 1 is in the specified position, preliminarily stored as the first reference position and the second reference position how the first position and the second position is changed. This allows, the positional deviation of the wafer 1 can be calculated by comparing the positions, of the first reference position with an actual first position and the second reference position with actual second position, respectively.

Processing thereafter is the same as when using the aligner sensor 24 as the sensor. Herein, it is determined that the positional deviation is an allowable value or lower (S206), corrects the target position based on the positional deviation, and is loaded the wafer 1 on the rotating base 21 (S207). Furthermore, when it is determined that the positional deviation exceeds the allowable value (S206), corrects the holding position of the wafer 1 by the hand 13 (S208).

As described above, the transport system 100 of this present embodiment includes the robot 10, the sensors (the aligner sensor 24, the protrusion detecting sensor 31) and the controller 19. The robot 10 having the hand 13 which supports the wafer 1 and transports the wafer 1 to the aligner apparatus 20. Before the robot 10 delivers the wafer 1 to the aligner apparatus 20, the sensor detects the position of the wafer 1 while supporting the wafer 1 on the hand 13. The controller 19 determines the positional deviation of the wafer 1 based on the detection value of the sensor.

As a result, since the positional deviation of the wafer 1 is detected before the wafer 1 is formed on the aligner apparatus 20, the problems that may occur in the aligner apparatus 20 by the positional deviation of a wafer can therefore be prevented.

As described above, in the transport system 100 of the present embodiment, the controller 19 determines whether or not the positional deviation of the wafer 1 is an allowable value or lower based on a detection value of the sensor. When the controller 19 determines that the positional deviation of the wafer 1 is an allowable value or lower, the robot 10 continues to transfer the wafer 1 to the aligner apparatus 20.

These conditions, it is possible to continue the work by confirming the positional deviation of the wafer 1 is zero or slight.

In the transport system 100 of the present embodiment, when the controller 19 determines that the positional deviation of the wafer 1 is an allowable value or lower, the robot 10 places the wafer 1 on the corrected target position which is the position corrected the target position for transporting the wafer 1 based on the positional deviation of the wafer 1.

This allows, the aligner apparatus can be performed alignment more exactly.

In the transport system 100 of the present embodiment, when the controller 19 determines that the positional deviation of the wafer 1 exceeds the allowable value, the robot 10 interrupts the transfer of the wafer 1 to the aligner apparatus 20.

This allows, the problem that may occur in the aligner apparatus 20 caused by the positional deviation of the wafer 1 is previously prevented.

In the transport system 100 of the present embodiment, the sensor is an aligner sensor 24 that detects the wafer 1 when the aligner apparatus 20 performs alignment of the wafer 1.

As a result, the positional deviation of the wafer 1 can be detected before the wafer 1 is placed on the aligner apparatus 20 without adding a new sensor. In addition, the positional deviation of the wafer 1 can be detected immediately before the wafer 1 is placed on the aligner apparatus 20.

In the transport system 100 of the present embodiment, the aligner sensor 24 is a light detecting sensor including the light emitting unit 24a and the light receiving unit 24b. The light emitting unit 24a irradiates an inspection light. The light receiving unit 24b receives the light blocked by the wafer 1 of a part of the inspection light and outputs a value corresponding to the light quantity. While moving the wafer 1 by the hand 13, the aligner sensor 24 detects plural times the wafer 1. Specifically, the aligner sensor 24 may have a configuration in which the inspection light receives the light reflected on the wafer 1 in the light receiving unit 24b.

In this result, the positional deviation of the wafer 1 can be detected before the wafer 1 is placed on the aligner apparatus 20 by using the light detecting sensor. Furthermore, detecting plural times the wafer 1 by the aligner sensor 24, the positional deviation of the wafer 1 can be detected in detail.

In the transport system 100 of the present embodiment, the aligner sensor 24 may be the CCD sensor that detects the position of the edge of the wafer 1.

And thus, the positional deviation of the wafer 1 can be detected by using the CCD before the wafer 1 is placed on the aligner apparatus 20.

In the transport system 100 of the present embodiment, the hand 13 removes the wafer 1 contained in the housing 30, and transports the wafer 1 to the aligner apparatus 20. The sensor is the protrusion detecting sensor 31 that detects whether or not the wafer 1 projects from the housing space of the housing 30.

As a result, the positional deviation of the wafer 1 can be detected before the wafer 1 is placed on the aligner apparatus 20 without adding a new sensor. In addition, the positional deviation of the wafer 1 can be early detected.

In the transport system 100 of the present embodiment, the sensor including the light emitting unit 31a and the light receiving unit 31b, and is detected whether or not the wafer 1 exists between the light emitting unit 31a and the light receiving unit 31b, based on whether or not the light receiving unit 31b receives the inspection light projected by the light emitting unit 31a. The controller 19 obtains plural times the positions of the hands 13 when the wafer 1 is detected the edge of the wafer 1, and is determined the positional deviation of the wafer 1 based on the positions of a plurality of hands 13.

Consequently, the positional deviation of the wafer 1 can be detected before the wafer 1 is placed on the aligner apparatus 20 by using the sensor that determines whether or not an object exists between the light emitting unit 31a and the light receiving unit 31b.

In the transport system 100 of the present embodiment, the hand 13 is a passive grip-type in which the wafer 1 is placed on the hand 13 to transports without holding the edge. The hand 13 may be an adsorption-type in which the surface of the wafer 1 is sucked to transports with a negative pressure.

Although the hand 13 of a passive grip-type or an adsorption-type having a simple structure, the positional deviation of the wafer 1 is likely to be occurred. By providing the configuration of the present embodiment, the point that the positional deviation of the wafer 1 is likely to be occurred can be remedied.

While a preferred embodiment and variations of the present invention have been described above, the above configurations may be modified, for example, as follows.

The flowchart shown in the embodiment described above is only an example, and some steps may be omitted, or some details of step may be changed, or new step may be added.

According to the embodiment described above, although there is an example of the optical sensor are given as the protrusion detecting sensor 31, is not limited to the optical sensor, and may be, an image sensor for example.

Instead of the configuration in which a base 11 is installed on the floor surface of the factory, the configuration in which the base 11 is installed on the ceiling surface (ceiling type) may be used.

The invention claimed is:

1. A transport system for transporting a wafer comprising:
a robot having a hand which supports the wafer and transports the wafer to an aligner apparatus comprising a sensor which detects a position of the wafer as the robot delivers the wafer to the aligner apparatus while supporting the wafer by the hand; and
a determination unit which determines whether a positional deviation of the wafer is an allowable value or lower based on a detection value of the sensor, wherein
in response to the determination unit determining that the positional deviation is the allowable value or lower, a target position of the wafer on the aligner apparatus is corrected; and
in response to the determination unit determining that the positional deviation exceeds the allowable value, a holding position of the wafer by the hand is corrected.

2. The transport system according to claim 1, wherein
in response to the determination unit determining that the positional deviation of the wafer is the allowable value or lower, the robot continues to transfer the wafer to the aligner apparatus.

3. The transport system according to claim 2, wherein
in response to the determination unit determining that the positional deviation of the wafer is the allowable value or lower, the robot places the wafer on a corrected target position which is a position on the aligner apparatus calculated by correcting the target position for transporting the wafer based on the positional deviation of the wafer.

4. The transport system according to claim 2, wherein
in response to the determination unit determining that the positional deviation of the wafer exceeds the allowable value, the robot interrupts a transfer of the wafer to the aligner apparatus.

5. The transport system according to claim 1, wherein
the sensor is a CCD sensor which detects the position of the edge of the wafer.

6. The transport system according to claim 1, wherein
the hand is a passive grip hand in which the wafer is placed on the hand and transported without holding the edge of the wafer or an adsorption hand in which the surface of the wafer is sucked with a negative pressure and transported.

7. The transport system according to claim 1, wherein:
the hand picks up the wafer housed in a housing, and transports the wafer to the aligner apparatus;

the sensor is a light detecting sensor comprising:
a light emitting unit irradiates an inspection light; and
a light receiving unit which receives a light which is the inspection light reflected by the wafer or a light which is the inspection light partly blocked by the wafer and outputs a value corresponding to the light quantity;
the sensor detects the wafer when the aligner apparatus performs alignment of the wafer; and
the sensor detects the wafer plural times while moving the wafer by the hand.

8. The transport system according to claim 1, further comprising an aligner sensor, wherein
the aligner sensor detects a rotation phase of the wafer, and
the rotation phase is adjusted after the wafer is delivered to the aligner apparatus when it is determined that a notch in the wafer does not face a predetermined direction.

9. The transport system according to claim 1, wherein
the sensor includes a light emitting unit and a light receiving unit, based on whether or not the light receiving unit receives an inspection light projected by the light emitting unit, detects whether or not the wafer exists between the light emitting unit and the light receiving unit, and
the determination unit obtains positions of the hand plural times when the sensor detects the edge of the wafer, and determines the positional deviation of the wafer based on the positions of the hand.

10. A method of transporting a wafer comprising:
supporting the wafer with a robot having a hand and transporting the wafer by the robot to an aligner apparatus;
detecting, by a sensor, a position of the wafer before the robot delivers the wafer to the aligner apparatus while supporting the wafer by the hand; and
determining a positional deviation of the wafer based on a detection value of the sensor, wherein
determining the positional deviation comprises determining whether or not the positional deviation of the wafer is an allowable value or lower based on the detection value of the sensor,
in response to determining that the positional deviation of the wafer is the allowable value or lower, a target position of the wafer on the aligner apparatus corrected, and transfer of the wafer by the robot to the aligner apparatus is continued; and
in response to determining that the positional deviation exceeds that allowable value, a holding position of the wafer by the hand is corrected.

11. A determination method which determines a positional deviation of a wafer during a transfer of the wafer comprising:
supporting the wafer using a hand of a robot which supports the wafer and transports the wafer to an aligner apparatus comprising a sensor,
detecting a position of the wafer by using the sensor while supporting the wafer by the hand as the robot delivers the wafer to the aligner apparatus, and
determining whether a positional deviation of the wafer is an allowable value or lower based on a detection value of the sensor, wherein
in response to determining that the positional deviation is the allowable value or lower, a target position of the wafer on the aligner apparatus is corrected; and
in response to determining that the positional deviation exceeds the allowable value, a holding position of the wafer by the hand is corrected.

12. The determination method according to claim 11, wherein:
the hand picks up the wafer housed in a housing, and transports the wafer to the aligner apparatus;
the sensor is a light detecting sensor comprising:
a light emitting unit irradiates an inspection light; and
a light receiving unit which receives a light which is the inspection light reflected by the wafer or a light which is the inspection light partly blocked by the wafer and outputs a value corresponding to the light quantity;
the sensor detects the wafer when the aligner apparatus performs alignment of the wafer; and
the sensor detects the wafer plural times while moving the wafer by the hand.

13. A transport system for transporting a wafer comprising:
a robot having a hand which supports the wafer and transports the wafer to an aligner apparatus;
a sensor which detects a position of the wafer before the robot delivers the wafer to the aligner apparatus while supporting the wafer by the hand; and
a determination unit which determines a positional deviation of the wafer based on a detection value of the sensor, wherein
the determination unit which determines whether or not the positional deviation of the wafer is an allowable value or lower based on the detection value of the sensor,
in response to the determination unit determining that the positional deviation of the wafer is the allowable value or lower, a target position of the wafer on the aligner apparatus is corrected, and the robot continues to transfer the wafer to the aligner apparatus, and
in response to the determination unit determining that the positional deviation exceeds the allowable value, a holding position of the wafer by the hand is corrected.

14. The transport system according to claim 13, wherein the target position of the wafer is corrected by moving the target position in a direction opposite to and by a same amount of the positional deviation.

15. The transport system according to claim 13, wherein the holding position of the wafer is corrected by removing the wafer from the hand and correcting the holding position with the wafer removed from the hand.

* * * * *